United States Patent
Sims

(10) Patent No.: US 10,620,147 B2
(45) Date of Patent: Apr. 14, 2020

(54) SENSOR INTERFACE FOR INTERFACING WITH A SENSOR

(71) Applicant: CamLab Limited, Cambridge (GB)

(72) Inventor: Stephen Charles Sims, Duxford (GB)

(73) Assignee: CAMLAB LIMITED, Cambridge (GB)

( * ) Notice: Subject to any disclaimer, the term of this patent is extended or adjusted under 35 U.S.C. 154(b) by 144 days.

(21) Appl. No.: 15/551,372

(22) PCT Filed: Feb. 12, 2016

(86) PCT No.: PCT/EP2016/053078
§ 371 (c)(1),
(2) Date: Aug. 16, 2017

(87) PCT Pub. No.: WO2016/131733
PCT Pub. Date: Aug. 25, 2016

(65) Prior Publication Data
US 2018/0045666 A1   Feb. 15, 2018

(30) Foreign Application Priority Data
Feb. 16, 2015  (GB) .................... 1502570.3

(51) Int. Cl.
*G01N 27/28* (2006.01)
*G06F 12/06* (2006.01)
(Continued)

(52) U.S. Cl.
CPC ....... *G01N 27/286* (2013.01); *G06F 12/0238* (2013.01); *G06F 12/0638* (2013.01);
(Continued)

(58) Field of Classification Search
CPC .............. G01N 27/286; G06F 12/0238; G06F 12/0638; G06F 2212/202; H04Q 9/00;
(Continued)

(56) References Cited

U.S. PATENT DOCUMENTS

| 7,719,427 B2 | 5/2010 | Hsiung et al. |
| 2005/0258034 A1* | 11/2005 | Iketaki ............... C12Q 1/006 204/403.01 |

(Continued)

FOREIGN PATENT DOCUMENTS

| EP | 1369684 | * | 1/2002 |
| EP | 1 369 684 A1 | | 12/2003 |

(Continued)

OTHER PUBLICATIONS

SevenExcellence, "Exel in the Lab with SevenExcellence" Unmatched pH Performance, Mettler Toledo, AG, Marketing pH Lab/Global MarCom Switzerland, Jun. 2013, in 20 pages.

(Continued)

*Primary Examiner* — Omar Casillashernandez
(74) *Attorney, Agent, or Firm* — Knobbe, Martens, Olson & Bear, LLP

(57) ABSTRACT

A sensor interface for interfacing with a sensor such as an electrochemical sensor, a temperature sensor or the like in which the interface comprises a memory configured to store data received at the interface from a sensor. The sensor interface is configured to assess the difference between data values in the memory, and to transmit advertising packets at a rate dependent on the difference between the values. The sensor interface includes a volatile memory and a non-volatile memory. The volatile memory is configured to store data received at the sensor interface from a sensor. The non-volatile memory is configured to store data stored in the volatile memory. The sensor interface is configured such that: data received at the sensor is stored in the volatile memory forming stored data until the volatile memory is substantially full and then at least some of the stored data is transferred to the non-volatile memory.

19 Claims, 6 Drawing Sheets

(51) Int. Cl.
*G11C 11/00* (2006.01)
*H04W 52/02* (2009.01)
*G06F 12/02* (2006.01)
*H04Q 9/00* (2006.01)

(52) U.S. Cl.
CPC ............ *G11C 11/005* (2013.01); *H04Q 9/00* (2013.01); *H04W 52/0258* (2013.01); *G06F 2212/202* (2013.01); *G06F 2212/205* (2013.01); *H04Q 2209/43* (2013.01); *H04Q 2209/826* (2013.01); *H04Q 2209/88* (2013.01); *Y02D 10/13* (2018.01); *Y02D 70/00* (2018.01); *Y02D 70/142* (2018.01); *Y02D 70/144* (2018.01)

(58) Field of Classification Search
CPC . H04W 52/0258; Y02D 70/142; Y02D 70/00; Y02D 70/144
USPC ........................................ 340/3.31
See application file for complete search history.

(56) References Cited

U.S. PATENT DOCUMENTS

| | | | |
|---|---|---|---|
| 2008/0041721 A1 | 2/2008 | Hsiung et al. | |
| 2010/0191082 A1* | 7/2010 | Brister | A61B 5/0002 600/345 |
| 2012/0179423 A1 | 7/2012 | Robl | |
| 2013/0036251 A1* | 2/2013 | Ree | G01D 4/00 711/103 |
| 2013/0238840 A1* | 9/2013 | Walsh | G11C 11/005 711/103 |
| 2014/0273256 A1* | 9/2014 | Batman | G08C 17/02 436/95 |
| 2015/0050902 A1* | 2/2015 | Umeki | H04Q 9/00 455/127.5 |
| 2015/0164391 A1* | 6/2015 | Hernandez-Rosas | A61B 5/002 600/365 |
| 2017/0026814 A1* | 1/2017 | Naiki | H04W 4/20 |
| 2018/0045666 A1* | 2/2018 | Sims | G01N 27/286 |
| 2018/0228369 A1* | 8/2018 | Sicurello | H04Q 9/00 |

FOREIGN PATENT DOCUMENTS

| | | |
|---|---|---|
| EP | 2 568 258 A1 | 3/2013 |
| WO | 2005/041463 A1 | 5/2005 |
| WO | 2014/087192 A1 | 6/2014 |

OTHER PUBLICATIONS

SevenExcellence, "pH/Ion Metter" Mettler Toledo, AG, Marketing pH Lab/MarCom Analytical, Sep. 2012, in 4 pages.

Search Report under Section 17(5) dated Aug. 14, 2015 for application No. GB1502570.3, in 4 pages.

International Search Report and Written Opinion of the International Searching Authority dated May 3, 2016 for International Application No. PCT/EP2016/053078, in 20 pages.

* cited by examiner

SENSOR INTERFACE FOR INTERFACING WITH A SENSOR

CROSS REFERENCE TO RELATED APPLICATIONS

This application is the U.S. National Phase Application under 35 U.S.C. § 371 of International Application No. PCT/EP2016/053078, filed Feb. 12, 2016, designating the U.S. and published as WO 2016/131733 A1 on Aug. 25, 2016 which claims the benefit of United Kingdom Patent Application No. 1502570.3, filed Feb. 16, 2015, which are hereby incorporated by reference in their entirety.

FIELD OF THE INVENTION

The present invention relates to a sensor interface for interfacing with a sensor such as an electrochemical sensor (for example, for pH, ion-selective, dissolved oxygen, or conductivity measurement), a temperature sensor or the like typically to provide wireless communication for the sensor.

BACKGROUND OF THE INVENTION

Electric sensors are well known in the measurement and instrumentation industry. They are used widely in laboratories and in the field to measure physical and chemical properties of samples. A typical electric sensor is an electrochemical sensor such as pH, ion-selective, dissolved oxygen or conductivity electrode or a temperature sensor. They are available commercially in several different form factors.

A meter may have both an electrochemical sensor and an electronic temperature sensor fitted to it. This is because the parameters being measured by the electrochemical sensor may be altered by the temperature of a solution under test and so both parameters need to be measured for an accurate electrochemical sensor reading. Such temperature sensors may be resistive such as a thermistor, RTD (resistance temperature detector) or PRT (platinum resistance thermometer) or actively producing current with respect to a temperature differential across them such as a thermocouple.

Typically, voltages in the order of millivolts are output from these sensors and these voltages are interpreted by a meter to provide units relative to the physical or chemical process being measured. Two examples of meters are bench mounted meters and handheld meters. Bench mounted meters are designed to be left in a fixed place and connected by cables to the relevant sensor. Handheld meters often have an electric sensor permanently attached to them via a connector, or a cable and connector assembly.

Typically, these meters will have a display or output of some type. These displays or outputs may be a digital number or other digital indicator such as a light emitting diode (LED) display, an analogue display using a moving coil d'Arsonval meter or some type of audible output.

The meter makes a unit conversion from voltage to the relevant unit, such as pH or temperature. To enable this, the meters are calibrated by placing the probe or sensor into a solution with known chemical properties.

These types of meter may have provision for a digital output of the values being read to a computing device through an interface such as a wired RS-232 or USB (Universal Serial Bus) connection or wirelessly using Bluetooth (registered trade mark) or IrDA (Infrared Data Association—a wireless infrared communications protocol).

Handheld meters less often have a digital output suitable for reception by a computing device than a bench mounted meter due to the context in which they are intended to be used. A digital output designed for reception by an external computing device creates the possibility of logging the output of the sensor with respect to time. However, this requires the computing device to be connected to the meter at all times which may be inconvenient if the sensor and meter is located in an environment that is hostile to such computing devices.

The presence of cables, even in a fixed location benchtop meter such as may be found in a laboratory, can be a significant inconvenience or indeed safety hazard when dealing with chemicals. They may even preclude the measurement of chemical attributes in some situations. For example, this may be due to the requirement to route the cables from the vessel that a chemical is contained in, to the meter that is situated outside the container. Alternatively, this may be due to the requirement to situate the meter far from the sensor, as might be the case when measuring water in a river from a bridge so that the integrity of the sensor output may be impaired.

Each meter has a physical and electronic termination for the sensor output. For this reason, most meters only have the capability to connect to a single sensor at a time, meaning that many meters are required to measure multiple attributes of even a single experiment. These multiple meters might then have to have logging performed simultaneously, either manually, by one or more operators, or digitally, by one or more computing devices.

As mentioned above, wireless meters that attach to electrochemical sensors are known that in some way use the Bluetooth (registered trade mark) wireless communications protocol that seek to eliminate some of these problems.

One arrangement is described in US patent application with publication US2008/0041721 (granted as U.S. Pat. No. 7,719,427). This document describes a wireless pH measurement system having a portable module including a signal detecting and processing portion comprising a sensor unit for detecting a pH signal, amplifying, filtering noise, analog/digital conversion and numerical processing to generate a pH measurement signal. The system also includes a wireless transmission portion that transmits the pH measurement by a Bluetooth (registered trade mark) module. The system also includes a receiver end that comprises a Bluetooth (registered trade mark) receiver for receiving the pH measurement signal and amongst other things, displaying the pH measurement, and the receiver end also processes this signal and transmits a warning when an abnormal pH measurement signal is received.

The pHit (trade mark) of Senova Systems, Inc., Sunnyvale, Calif., United States is a handheld pH meter with a non-calibrating solid state sensor and a Bluetooth (registered trade mark) dongle. The signal from the sensor is processed by electronics in the handheld meter and can then be transmitted to a local display or to a PC, tablet computer, or process controller via the Bluetooth (registered trade mark) dongle.

The Myron L (registered trade mark) PTBT1 (pH) and PTBT2 (conductivity) of the Myron L Company, Carlsbad, Calif., United States are "pen-type" meters with a Bluetooth Smart (registered trade mark) transceiver that transmits measurements to any paired mobile device where the readings are displayed. The mobile device acts as the display for the meter effectively replacing the meter that is normally integral with a "pen-type" meter.

There are also electric sensor products that communicate with wireless protocols other than Bluetooth. An example of such an arrangement is the Seneye system of Seneye Ltd, Norwich, Norfolk, United Kingdom, which is a pond and aquarium water quality monitor. It uses a colorimetric sensor chip for pH, temperature and ammonia measurement. It requires hard wiring or external transmission box for WiFi communication of the measured data.

Another example is the Game ePool smart system. This is a wireless water chemistry monitoring system for pH, chlorine and temperature monitoring. It uses WiFi to transmit measured data to a computer for the computer to analyse the measure data. It suffers from short battery life and range.

The Go Wireless pH (registered trade mark) of Vernier, Beaverton, Oreg., United States is a general-purpose, wireless pH sensor that can be used to remotely monitor pH. It communicates pH measurements wirelessly using Bluetooth Smart (registered trade mark) from the sensor to an Apple iPad (registered trade mark) tablet computer.

BRIEF SUMMARY OF THE INVENTION

Known arrangements such as the many described above with separate sensors and meters with wireless communication between the meter and the sensor are power intensive. Power is used to store sensor data and to transmit it to the meter. In known arrangements, that use batteries for power, the battery life of the sensor is low. While this is inconvenient in some sensor applications such as for domestic use it is acceptable. However, for other applications such as for sensor use in remote areas for occasional readings from the sensor it is not acceptable. In these types of applications, a battery life of at least one year is considered desirable.

Embodiments of the invention described herein provide an energy efficient sensor interface for interfacing with a sensor. Preferably, the sensor interface is for wireless transmission of sensor data to a separate meter. Preferably, the meter is an electronic device such as a smart phone or mobile phone, or computer (for example, a general purpose computer such as a laptop computer, desktop computer (PC) or tablet computer). Preferably, the electronic device includes appropriate software or an app to act as a meter. Preferably, the wireless transmission protocol from sensor interface to electronic device is Bluetooth (registered trade mark) and, in particular, Bluetooth Smart (registered trade mark), which is the low energy variant of Bluetooth.

The invention in its various aspects is defined in the independent claims below to which reference should now be made. Advantageous features are set forth in the dependent claims.

Generally, arrangements described herein relate to a wireless interface or meter that allows the digitising of an analogue voltage such as that produced by an electrochemical sensor or other sensor or sensors into a digital format for transmission, or storage for transmission at a later time, to a computing device.

Arrangements are described in more detail below and take the form of a sensor interface for interfacing with a sensor such as an electrochemical sensor, a temperature sensor or the like, in which the sensor interface comprises a memory configured to store data received at the sensor interface from a sensor. The sensor interface is configured to assess the difference between data values in the memory, and to transmit advertising packets at a rate dependent on the difference between the values. The sensor interface comprises a volatile memory and a non-volatile memory. The volatile memory is configured to store data received at the sensor interface from a sensor. The non-volatile memory is configured to store data stored in the volatile memory. The sensor interface is configured such that: data received at the sensor interface is stored in the volatile memory forming stored data until the volatile memory is substantially full and then at least some of the stored data is transferred to the non-volatile memory.

A computer memory is full or reaches its capacity when all the space it has for storing data has data stored in it.

Volatile memory is computer memory that requires power to maintain stored data, such as random access memory (RAM). Non-volatile memory is computer memory that requires no power to maintain the stored data, such as read only memory (ROM).

In an aspect of the present invention, there is provided, a sensor interface for interfacing with a sensor such as an electrochemical sensor, a temperature sensor or the like; the sensor interface comprising: a volatile memory configured to store data received at the sensor interface from a sensor; and a non-volatile memory configured to store data stored in the volatile memory; wherein the sensor interface is configured such that: data received at the sensor interface is stored in the volatile memory forming stored data until the volatile memory is filled to a predetermined memory level and then at least some of the stored data is transferred to the non-volatile memory.

This is a low power arrangement for storing sensor data. This is because there is less writing and erasing to non-volatile memory of known arrangements, and such writing and erasing to non-volatile memory has high power requirements.

The sensor interface may be configured to store an initial time of initial data and a time between data. The sensor interface may be further configured to store data periodically over a period. The sensor interface may be further configured to increment a counter each time data is stored to form a counter value. The sensor interface may be further configured to store the counter value at the end of the period.

The sensor interface may be further configured to overwrite data stored in the volatile memory once the volatile memory is filled to the predetermined level with new data.

The sensor interface may be further configured to also transmit the new data to a target electronic device. The new data may be transmitted in a data packet. The data packet may comprise an advertising packet. The advertising packet may be an advertising packet of a Bluetooth Smart data stream.

The advertising packet is part of a data stream that allows the discovery of devices available in the vicinity of the transmitting device.

The sensor interface may be configured to receive a signal from a target electronic device to initiate a communication connection with the sensor interface. The sensor interface may be configured to receive a signal from a target electronic device indicating data not received from the sensor interface. The sensor interface may be configured to transmit the data indicated as not received from the sensor interface in response to receiving the signal from a target electronic device indicating data not received from the sensor interface from the volatile memory if available otherwise from the non-volatile memory.

The sensor interface may further comprise a processor to control the transfer of at least some of the stored data to the non-volatile memory. The volatile memory may be integral with the processor.

The sensor interface may be configured to assess the difference between data values in the non-volatile memory, and to transmit advertising packets at a rate dependent on the difference between the data values.

The predetermined memory level may comprise 50% or more of the capacity of the volatile memory, 75% or more of the capacity of the volatile memory, 90% or more of the capacity of the volatile memory, substantially the capacity of the volatile memory, or the capacity of the volatile memory. The predetermined memory level may be 50 to 75%, 76 to 90% or 90 to 100% of the capacity of the volatile memory.

In another aspect of the present invention, there is provided a sensor interface for interfacing with a sensor such as an electrochemical sensor, a temperature sensor or the like; the sensor interface comprising: a memory configured to store data received at the sensor interface from a sensor; wherein the sensor interface is configured to assess the difference between data values in the memory, and to transmit advertising packets at a rate dependent on the difference between the values.

The data values may be consecutive data values. A sensor may comprise a sensor interface described above.

In another aspect of the present invention, there is provided a method for storing data in a sensor interface for interfacing with a sensor such as an electrochemical sensor, a temperature sensor or the like; the method comprising: storing data received at the sensor interface from a sensor in a volatile memory forming stored data until the volatile memory is filled to a predetermined memory level; and then transferring at least some of the stored data to a non-volatile memory.

In another aspect of the present invention, there is provided a method for transmitting an advertising packet from a sensor interface for interfacing with a sensor such as an electrochemical sensor, a temperature sensor or the like; the method comprising: storing data received at the sensor interface from a sensor in memory; assessing the difference between data values in the memory, and transmitting advertising packets at a rate dependent on the difference.

A computer program may be provided for implementing the method described above.

A computer readable medium may be provided containing a set of instructions that causes a computer to perform the method described above.

BRIEF DESCRIPTION OF THE DRAWINGS

The invention will be described in more detail, by way of example, with reference to the accompanying drawings, in which.

DETAILED DESCRIPTION OF THE INVENTION

Example sensor interfaces 10 will now be described with reference to FIGS. 1 to 6.

Figure 1:
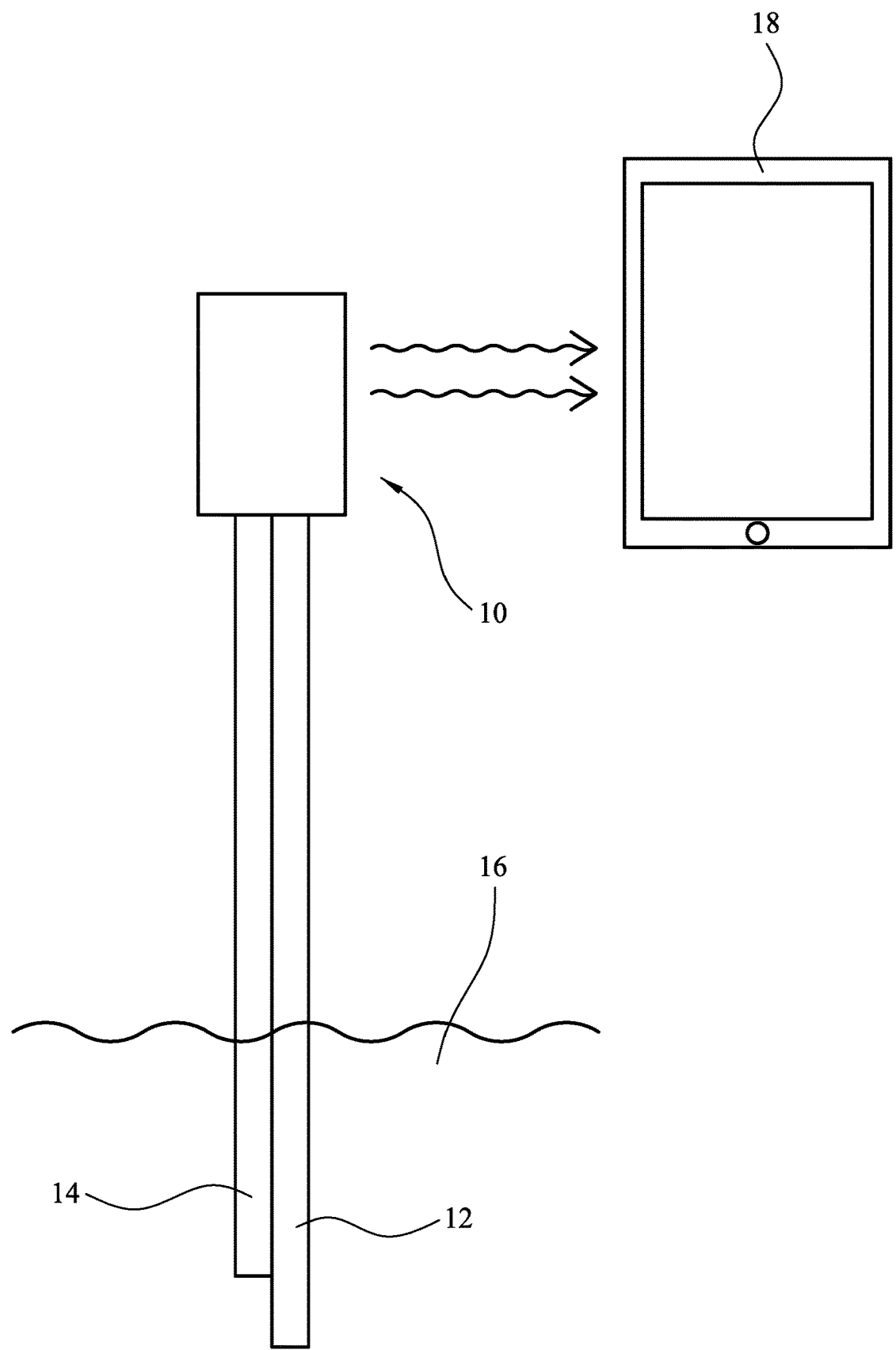
FIG. 1 is a schematic diagram of a sensor interface embodying an aspect of the present invention interfaced with a sensor in communication with an electronic device in the form of a smart phone.

In the example of FIG. 1, the sensor interface 10 for interfacing with a sensor 12,14 such as an electrochemical sensor, a temperature sensor or the like is illustrated connected to a pair of sensors in the form of an electrochemical sensor 12 and a temperature sensor 14. The sensors or probes are cylindrical with a circular cross-section having significantly greater length than diameter. The sensors are located next to one another and with their longitudinal axes parallel to one another. The sensors have an electrical connection at their proximal end. This electrical connection includes a conductor that forms an electrical connection to the electrode performing the sensing. In the example of FIG. 1, the distal end of the sensors are located in a chemical 16 whose properties are being measured by the sensors 12,14. Each of the sensors provide a millivolt output to the sensor interface giving an indication of electrochemical and temperature of the chemical 16 respectively. The sensor interface or cap 10 is detachably connectable, in this example, by including threads in an inner portion that interface with a complementary screw on the sensor or probe (not shown). Alternatively, the sensor interface may be integral with rather than separably detachable from the sensors.

Broadly, the temperature sensor stores and periodically transmits data representing the physical properties of the chemical 16 to a target electronic device in the form a smart phone 18 as well as calibration data. The smart phone includes appropriate software or an app to act as a meter. The data is transmitted in a wireless transmission protocol from sensor interface to smart phone in the Bluetooth (registered trade mark) and, in particular, Bluetooth Smart (registered trade mark) format. In this example, a general purpose computing device in the form of a smart phone is illustrated, however, the computing device may be a tablet computer, a personal computer, mobile handset or a digital embedded system all running a proprietary application or software. The computing device controls measurement settings for simple read functions or more complex timed log readings. The computing device transmits these settings to the sensor interface which then operates as required.

Figure 2:
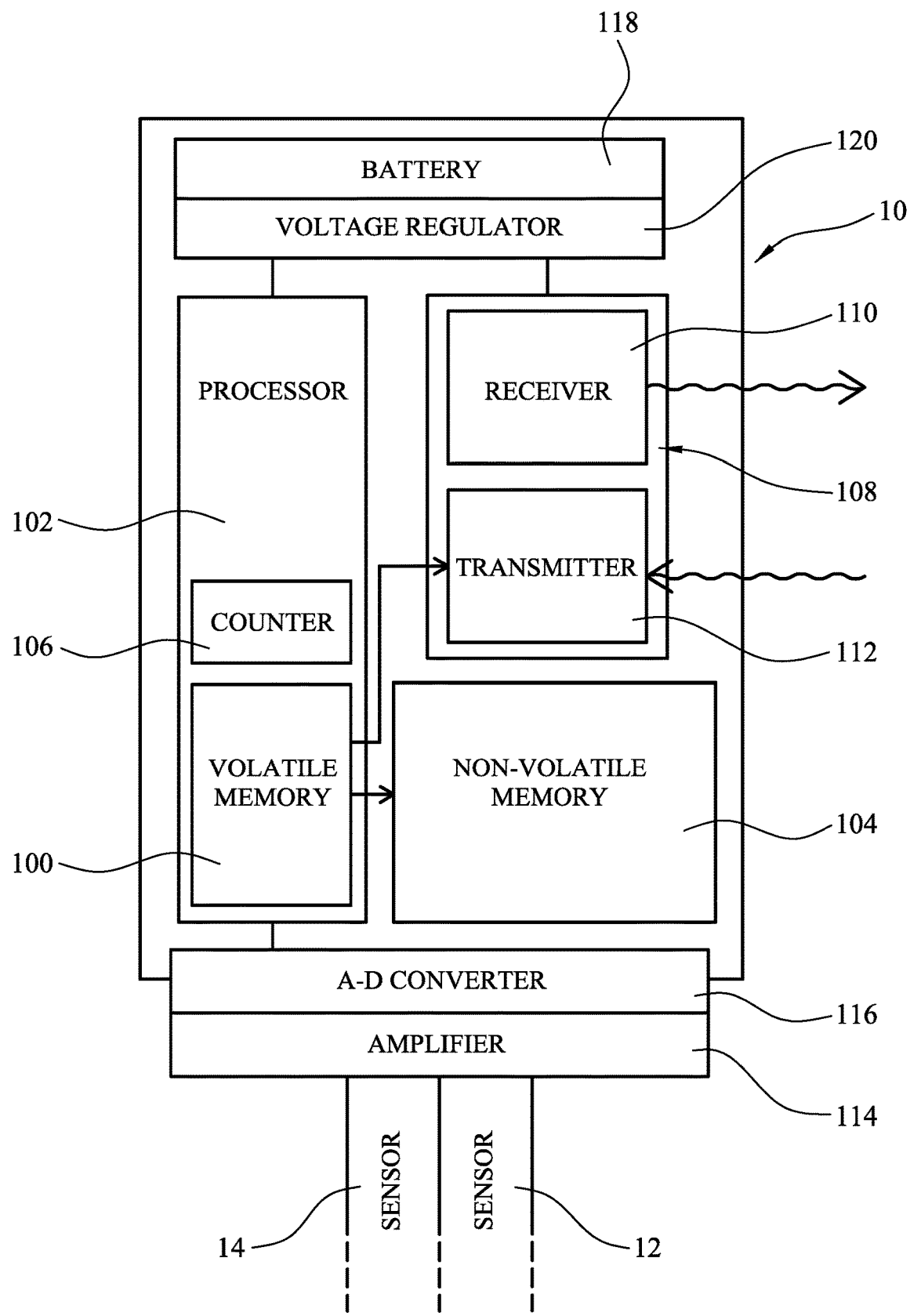
FIG. 2 is a schematic diagram of the sensor interface of FIG. 1.

The sensor interface 10 is shown in more detail in FIG. 2 and like features to FIG. 1 have been given like reference numerals.

The sensor interface includes a volatile memory 100 configured to store data in digital form received in analogue form at the sensor interface from the sensors 12,14. The volatile memory is integral with a processor 102 or a central processing unit (CPU), which in this example is a microcontroller. In this example, the volatile memory is RAM. The sensor interface includes non-volatile memory 104 configured to store data in digital form stored or previously formed in the volatile memory. In this example, the non-volatile memory or electronic storage is ROM such as an EEPROM (Electrically Erasable Programmable Read-Only Memory) or Flash memory device. The sensor interface also includes a counter 106.

The sensor interface 10 includes a radio transceiver 108 with a receiver 110 and transmitter 112. This enables communication connection to and from the target computing device (not illustrated in FIG. 2) using, in this example, the Bluetooth Smart wireless protocol for radio communications.

An amplifier 114 is provided in the sensor interface 10 to amplify the electrical signals (of the order of millivolts) of sensor outputs from the sensors 12,14 and provide them to an analogue to digital converter 116 to convert to a digital signal also provided in the sensor interface package.

The sensor interface 10 includes a battery 118. A voltage regulator 120 is provided for voltage regulation to take account the change in the battery's supply voltage over time. The battery, through the voltage regulator, provides electrical power to the various electrical components described above.

Broadly, the sensor interface 10 provides non-volatile electronic storage of the digitally converted analogue voltages from the sensors 12,14 over a period of time and radio transmission and reception for communicating with the computing device.

Significantly, the sensor interface 10 is configured such that data received at the sensor interface from the sensors 12,14 in analogue form is stored in the volatile memory 100 in digital form following amplification by the amplifier 114 and analogue to digital conversion by the analogue to digital converter 116 until the volatile memory is full. Then, at least some or all of the stored data is transferred to the non-volatile memory. This provides a low energy solution due to the high power requirements of erasing or writing to non-volatile memory because the amount of erasing or writing is low or minimised.

In use, at the expiration of a regular time period, which may be a predetermined value such as default value programmed at a factory or a user programmed value set using the computing device, the digitised value of the sensors 12,14 output voltages are recorded for that particular time under the control of the processor microcontroller 102. In this way, the values reported by the sensors can be used to provide a record of some measured parameter of the solution or chemical under test with respect to time. This mode of operation is called logging. Logged data is stored in the volatile memory 100 located internally to the central processing unit 102 until such time as there is no more space remaining in the volatile memory and then a batch of logged values is written at the same time. This allows the non-volatile memory to be kept in a very low power state until it is necessary to power it up and perform a write operation on it.

In this example, the volatile memory has a capacity of 128 bytes. Three bytes are used for each pH reading or log and two bytes are used for each temperature reading or log. Thus, a batch of 25 pH and temperature readings are stored in volatile memory before no further pH and temperature readings can be stored in the volatile memory and the batch of readings are then transferred to the non-volatile memory. The volatile memory may have a different, larger capacity, for example, 256 bytes. In which case, 51 pairs of pH and temperature readings can be made before the volatile memory has reached its capacity and the batch of readings is then transferred to the non-volatile memory. If a 256 byte volatile memory stored 25 readings before it transferred these readings to non-volatile memory, this would use the same power as the volatile memory of 128 byte capacity, half of the capacity as the 256 byte memory.

A low power requirement is still provided by the sensor interface if data received at the sensor interface is stored in the volatile memory until the volatile memory is filled to another predetermined memory level other then full before stored data is transferred to the non-volatile memory. For example, the predetermined memory level may be 50% or more of the capacity of the volatile memory, 75% or more of the capacity of the volatile memory, or 90% or more of the capacity of the volatile memory.

In order to reduce the amount of space needed in non-volatile memory 104 and the need for maintaining a real time clock on the cap or sensor interface, when a logging operation is started, at the request of the user, a timestamp and a period between log samples is written to the sensor interface. Under the control of the processor, values from the sensors 12,14 are then written to the log and the internal counter 106 is incremented to record the number of samples that are currently stored. This negates the need to store a real timestamp along with each logged sample and sample times can instead be calculated by multiplying the counter by the logging period and adding it to the timestamp.

The computer device (not shown in FIG. 2) includes a mobile software application running on it. This interfaces to the cap or sensor interface 10 using the Bluetooth Smart radio communications protocol in order to command the sensor interface to perform various functions such as starting and stopping the logging within the internal memory 100, 104 of the sensor interface, measured values periodically and also to retrieve data from the sensor interface either about itself, such as its current battery level, and information from the sensors 12,14. The mobile software application is also capable of subsequently transmitting the logged sensor values from the sensor interface to a network based server software application over Wi-Fi or other communications protocol for subsequent off-computing device analysis.

The Bluetooth Smart radio protocol has a number of operating modes that can be used. In ordinary operation, when the battery 118 is inserted into the sensor interface, the sensor interface, adopting the role of a Bluetooth Smart server, sends out or transmits an advertising packet at a programmable time interval. As described above, advertising packet is part of a data stream that allows the discovery of devices available in the vicinity or neighbourhood of the transmitting device such as in communication range. The advertising packet may contain, amongst other things, the unique address of the sensor interface so that the computing device, adopting the role of a Bluetooth Smart client, can respond to that advertising packet and enter a connected mode. When both devices (computing device and sensor interface) have agreed to enter the connected mode, a connection interval is negotiated between them. As a time synchronised network protocol, both the sensor interface and computing device use this connection interval to determine at what points or times they will enable their radio transceivers to see if either device has transmitted a message to the other. This interval is a trade off between power consumption, the total number of possible simultaneous connections with other devices and delay in sending data. A very short connection interval requires the radios of both devices to be enabled frequently at the expense of power, however, there is only a maximum delay of one connection interval required before data is transferred between devices. A long connection delay, on the other hand, is much more power efficient. However, the delay in transmitting data is correspondingly longer.

The inventors of the present patent application have appreciated that the time interval or period between the sensor interface 10 sending out or transmitting an advertising packet or the advertising packet transmission rate may be varied for energy efficiency. In order to produce what appears to be a responsive meter display at the computing device 18, the sensor interface may continuously, at a fixed period (for example, every second), send advertising packets containing data, such as pH reading, temperature and other information. However, the inventors of the present patent application have appreciated that most chemical reactions being measured by the sensors 12,14 will finish after a period of time after the chemical reaction has started at which point, the inventors of the present patent application have appreciated, there is nothing to be gained by sending identical advertising packets to the computing device as the display will not be updated. In contrast, at the start of a chemical reaction, when chemicals are initially mixed, the rate of change of the parameter being measured by the sensors, such as pH is relatively high. In which case, the inventors of the present patent application have appreciated, that under such conditions it is preferable to increase the rate at which the values or data from the sensors are reported to the computing device so that this high rate of change can be recorded. The sensor interface of the embodiments of the present invention, therefore, includes software that dynamically changes the period between transmissions of advertising packets in such a way as to provide for appropriate responsiveness at all states of a chemical reaction. The sensor interface transmits advertising packets with a period stepwise proportional to the rate of change of the parameter being measured by the sensors. This is achieved by the processor 102 of the sensor interface, under software control, assessing the difference between data values in the non-volatile memory, and the sensor interface transmitting an advertising packet dependent or proportional to the difference.

The value read at the sensors 12,14 at each sampling period is stored in the volatile memory 100 on the processor or central processing unit 102 within the sensor interface 10 within a circular buffer. In a circular buffer, a certain number of values can be stored, overwriting the oldest stored values when the buffer wraps around after a certain amount of data has been stored. At the same time, this value is added to the Bluetooth Smart advertising packet so that the previously described connection mode does not need to be entered in order for a Bluetooth Smart client such as the computing device, to read an instantaneous value from the sensors. Radio communications are inherently unreliable, however, and there will likely be advertising packets that are not received by the computing device. In these cases, the computing device will initiate a connection with the sensor interface and request that the sensor interface sends it the values that have been missed. Using this arrangement, the sensor interface is able to have low power consumption in good radio conditions by only sending advertising packets and when poor radio conditions are encountered, and an advertising packet is not received by the computing device, the historical value or values can be read over a short-lived connection and then monitoring of the advertising packets is resumed.

Data is retrieved from the sensor interface 10 by the computing device as raw digital representations of the analogue voltage as produced by the sensors. This is in contrast to performing the known subsequent step of converting the raw digital representation, using the values stored during calibration, to an actual value representing the chemical property being measured. The approach of passing the raw digital representation, as well as having the calibration values stored on the sensor interface for retrieval by any computing device, allows the computing device to perform the conversion calculation using a value from the temperature sensor 12 that may be separate to the sensor interface interfacing to the electrochemical sensor 14.

Figure 3:
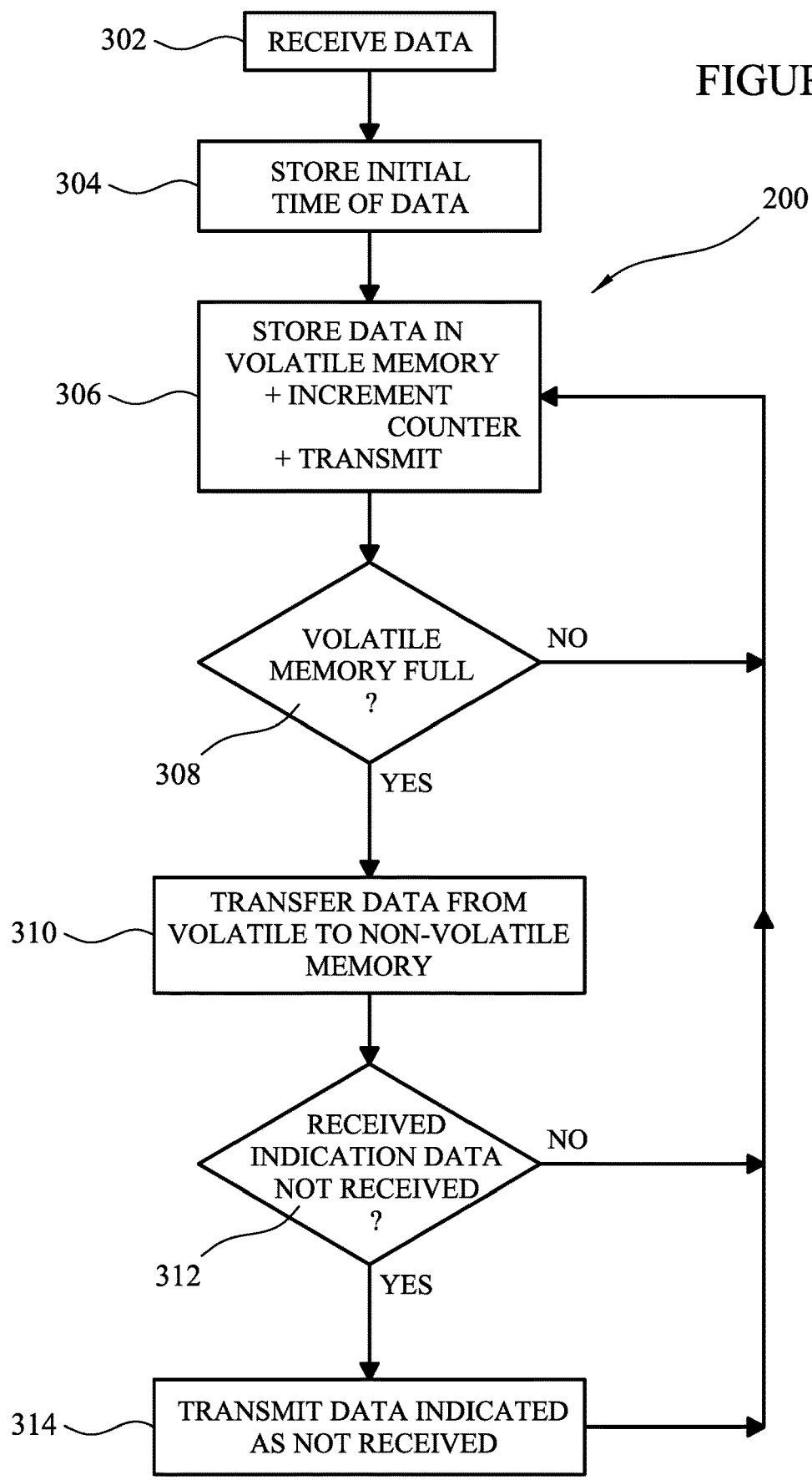
FIG. 3 is a flow diagram illustrating the method implemented by the sensor interface of FIGS. 1 and 2.

This is explained with reference to the flow chart 200 of FIG. 3 that illustrates the method implemented by the sensor interface 10.

Data is received from the sensors as illustrated by step 302 forming sensor data. An initial time of initial data received and a time between sensor data is also stored (step 304). As illustrated at step 306, data is stored periodically over a period in volatile memory 100. The counter 106 is incremented each time data is stored to form a counter value. The counter value is stored at the end of the period over which data is measured. The processor 102 of the sensor interface assesses or measures whether the volatile memory is full (step 308). If the volatile memory is full, then the processor or controller controls the transfer of the stored data to the non-volatile memory and the stored data is transferred to the non-volatile memory (step 310). Data continues to be received from the sensors and data stored in the volatile memory is overwritten with new data. The new data is transmitted to a target electronic device in a data packet in the form of an advertising packet of a Bluetooth Smart data stream.

As shown at step 312, the sensor interface 10 may receive a signal from the target electronic device to initiate a communication connection with the sensor interface. The sensor interface may receive a signal from a target electronic device indicating data not received from the sensor interface. In which case, in response, the sensor interface is configured to transmit the data indicated as not received from the sensor interface. This is explained in more detail below with reference to FIG. 4.

Figure 4:
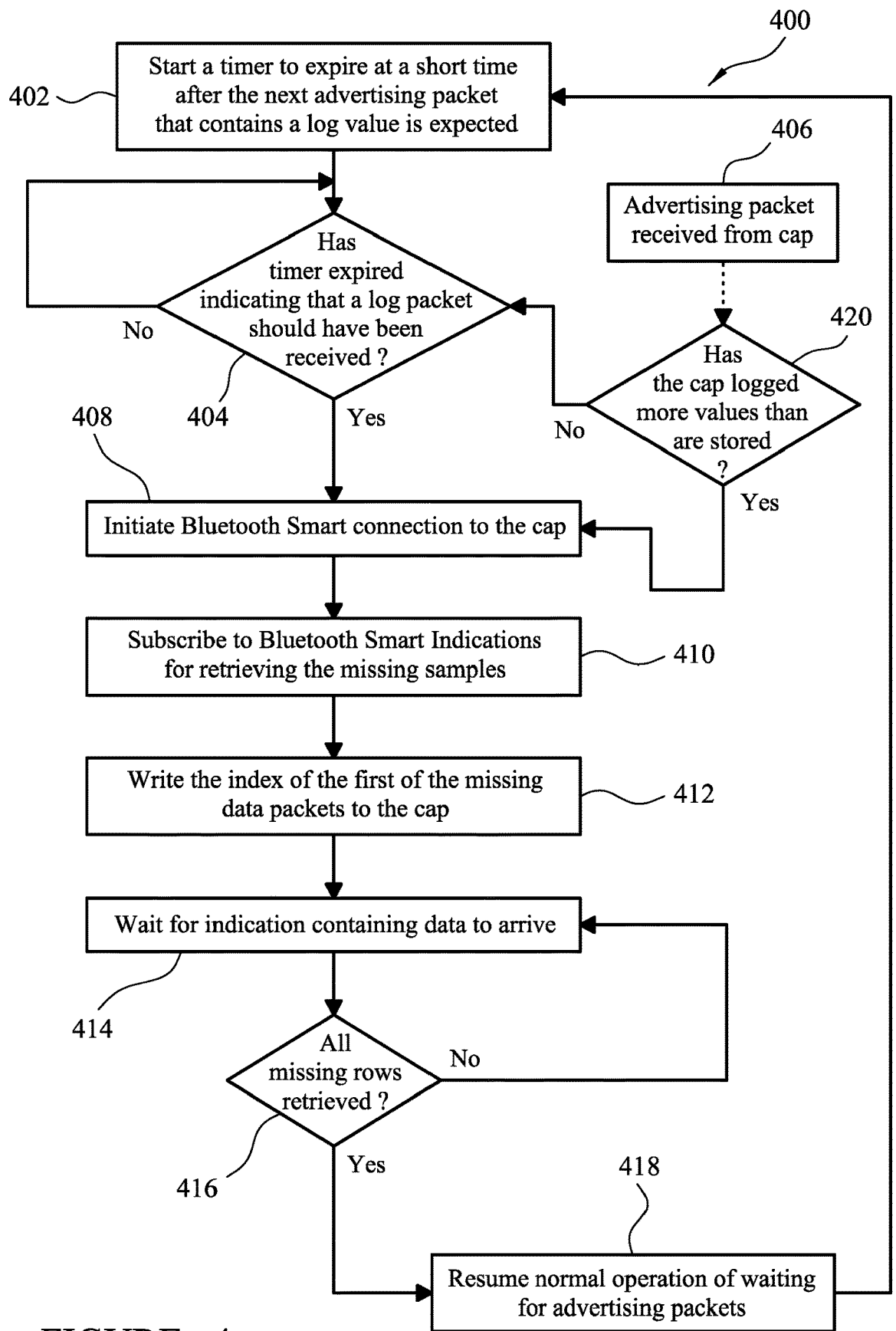
FIG. 4 is a flow diagram illustrating the method implemented by the sensor interface of FIGS. 1 to 3 and the electronic device of FIG. 1.

As illustrated in the flow diagram 400 of FIG. 4, the target electronic device starts a timer after the next advertising packet is expected from the sensor interface 10 (step 402). The length of time on the timer corresponds to slightly less than the time to fill the volatile memory of the sensor interface with data. If the timer of the target electronic device does not expire before the next advertising packet is received at the target electronic device from the sensor interface (step 406), then no action is taken as a result by the electronic device; the missed data is transmitted from the volatile memory to the target electronic device. If the timer of the target electronic device expires before the next advertising packet is received at the target electronic device from the sensor interface (step 404), then a Bluetooth Smart connection to the sensor interface is initiated by the target electronic device (step 408). The target electronic device subscribes to Bluetooth Smart indications for retrieving the missing samples (step 410). The index of the first of the missing data packets is written to the sensor interface (step 412). The target electronic device waits for an indication containing the data to arrive (step 414). If the missed data is available in the volatile memory of the sensor interface, then the missed data is provided from the volatile memory otherwise it is provided from the non-volatile memory of the sensor interface. As the data arrives from the sensor interface at the electronic device, the electronic device checks if all the missing rows of data have been received (step 416). Once all of the missing rows have been received from the sensor interface at the electronic device, the target electronic device resumes normal operation of waiting to receive advertising packets from the sensor interface (step 418) and the method described above is repeated with the target electronic device starting a timer after the next advertising packet is expected from the sensor interface is expected (step 402). Even if the timer has not expired, as indicated at step 420 of the flow diagram of FIG. 4, if it is indicated that the cap has logged more values or data than are stored on the target electronic device, then the Bluetooth Smart connection to the sensor interface is initiated by the target electronic device (step 408) and the process continues in the same way as explained above.

Figure 5:
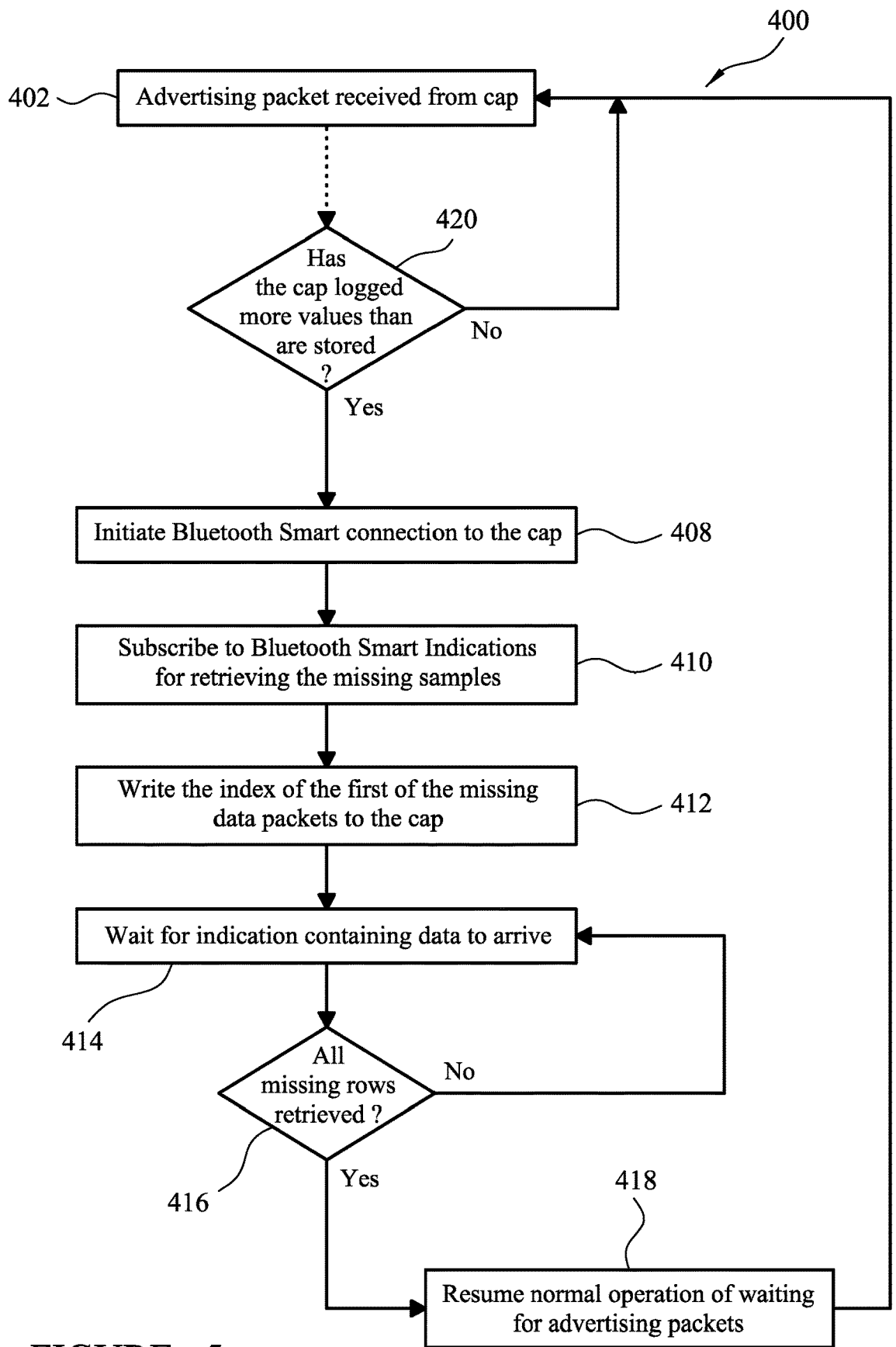
FIG. 5 is flow diagram illustrating an alternative method to that illustrated in FIG. 4 implemented by the sensor interface of FIGS. 1 to 3 and the electronic device of FIG. 1.

Alternatively, as illustrated in FIG. 5, the arrangement does not have the timer arrangement (steps 402 and 404 of FIG. 4), and only includes an indication that the cap has logged more values or data than are stored on the target electronic device to trigger or initiate the Bluetooth Smart connection to the sensor interface.

Figure 6:
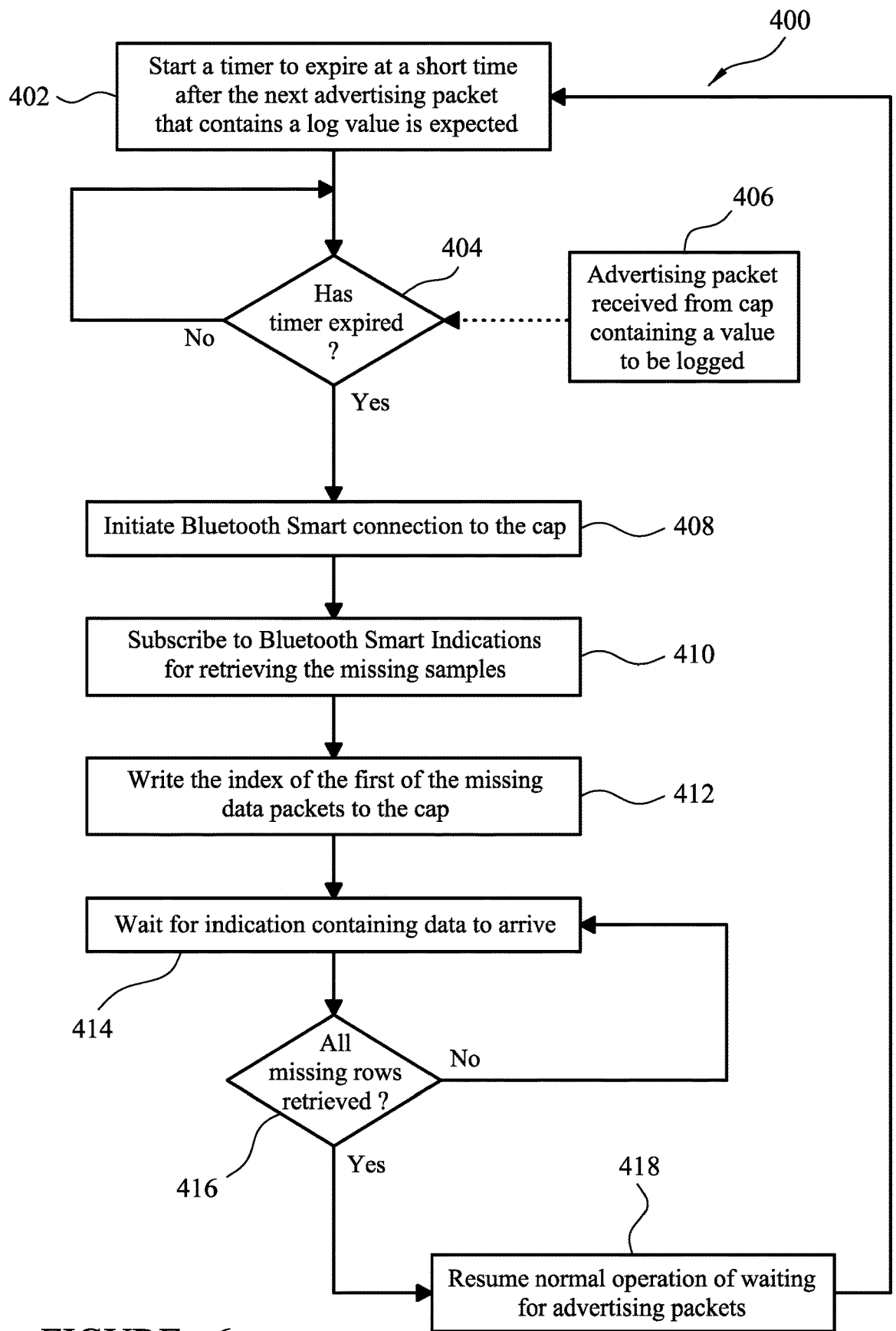
FIG. 6 is flow diagram illustrating an alternative method to those illustrated in FIGS. 4 and 5 implemented by the sensor interface of FIGS. 1 to 3 and the electronic device of FIG. 1.

In another alternative, as illustrated in FIG. 6, the arrangement has the timer arrangement (steps 402 and 404 of FIG. 4), but not the step 420 of the target electronic device initiating the Bluetooth Smart connection to the sensor interface if it is indicated via the advertising packet from the cap that the cap has logged more values or data than are stored on the target electronic device. In this arrangement, the Bluetooth Smart connection to the sensor interface is initiated only if the timer has expired.

In this way, with these arrangements, as a missed packet can be detected soon after the packet has been missed, it is likely that the volatile memory of the cap or sensor interface will contain the required missed data and therefore power costly read from non-volatile memory can be avoided. In the case that the sensor interface has been left logging for an extended period without being in Bluetooth range or communication connection of the target electronic device then the non-volatile memory is read to provide the data.

A Bluetooth connection state between the sensor interface and the target electronic device is very power hungry and therefore connections are only maintained for a short period of time. In this example, the Bluetooth connection is only formed for long enough for the target electronic device to read the missed log data from the sensor interface over the opened connection.

As described above, these features provide a very energy efficient sensor interface, which therefore has long battery life.

As described further above, the sensor interface of the embodiments of the present invention include software that dynamically changes the period between transmissions of advertising packets in such a way as to provide for appropriate responsiveness at all states of a chemical reaction. The sensor interface transmits advertising packets with a period stepwise proportional to the rate of change of the parameter being measured by the sensors. Advertising packets may be transmitted at a plurality of discrete intervals (for example, two or three different discrete intervals) depending on the difference between consecutive readings from the analogue to digital converter 116 of the sensor interface. This is achieved by the processor 102 of the sensor interface, under software or firmware control, assessing the difference between data values in the non-volatile memory, and the sensor interface only transmitting an advertising packet if the difference between data values is at or above a predetermined level. The discrete intervals may be, for example, 0.25 s and 1 s; or 0.25 s, 1 s and 10 s. This is explained in more detail below.

Typically, the interval between transmission of advertising packets is initially set at a minimum level such as, for example, 0.25 seconds by the processor 102 (see FIG. 1). That is to say, a high or maximum advertising packet transmission rate. The processor 102 measures the difference between consecutive readings from the analogue to digital converter 116. If this difference is small at or below a predetermined low level, for example between 0 mV and 1 mV, then the advertising transmission rate is set low and to a minimum level such as, for example, 10 seconds. If this difference is large at or above a predetermined high level, for example between 5 mV and 20 mV, then the advertising transmission rate is set high and to the maximum level of, for example, 0.25 seconds. If this difference is between the predetermined high and low levels, for example, between 1 mV and 5 mV, then the advertising transmission rate is set at a mid-rate between the minimum and maximum levels such as, for example, 1 second.

There may be more than three predetermined advertising transmission rates or steps. The maximum advertising packet transmission rate may be, for example, between 0.1 second and 1 second. The minimum advertising packet transmission rate may be, for example, between 5 seconds and 20 seconds. The mid-rate advertising packet transmission rate may be, for example, between 0.5 seconds and 5 seconds.

Embodiments of the present invention have been described. It will be appreciated that variations and modifications may be made to the described embodiments within the scope of the present invention.

What is claimed is:

1. A sensor interface for interfacing with a sensor, the sensor interface comprising:
 a memory configured to store data received at the sensor interface from a sensor; and
 a processor configured to:
  determine a rate of change of at least one parameter being monitored by the sensor based on a difference between data values in the memory;
  determine a transmission rate of advertising packets based on the determined rate of change of the at least one parameter being monitored by the sensor; and
  transmit advertising packets at the determined transmission rate.

2. A sensor interface according to claim 1, wherein two or more of the data values are consecutive data values.

3. A method for transmitting an advertising packet from a sensor interface for interfacing with a sensor, the method comprising:
 storing data received at the sensor interface from a sensor in memory;
 determining, by a processor, a rate of change of at least one parameter being monitored by the sensor based on a difference between data values in the memory;
 determining, by the processor, a transmission rate of advertising packets based on the determined rate of change of the at least one parameter being monitored by the sensor; and
 transmitting, by the processor, advertising packets at the determined transmission rate.

4. A method according to claim 3, wherein two or more of the data values are consecutive data values.

5. A sensor interface according to claim 1, the sensor interface further comprising:
 a volatile memory configured to store data received at the sensor interface from a sensor; and
 a non-volatile memory configured to store data stored in the volatile memory,
 wherein the processor is configured to: store data received at the sensor interface in the volatile memory forming stored data until the volatile memory is filled to a predetermined memory level and, in response to determining that the memory is filled to the predetermined memory level, transfer at least some of the stored data to the non-volatile memory.

6. A sensor interface according to claim 1, wherein the processor is further configured to store an initial time of initial data and a time between data.

7. A sensor interface according to claim 5, wherein the processor is further configured to overwrite data stored in the volatile memory in response to determining that the volatile memory is filled to the predetermined memory level with new data.

8. A sensor interface according to claim 5, further configured to transmit new data to a target electronic device in the advertising packets.

9. A sensor interface according to claim 1, wherein at least one advertising packet is an advertising packet of a Bluetooth Smart data stream.

10. A sensor interface according to claim 1, wherein the sensor interface is further configured to receive a signal from a target electronic device to initiate a communication connection with the sensor interface.

11. A sensor interface according to claim 10, wherein the sensor interface is further configured to receive a signal from the target electronic device indicating data not received from the sensor interface.

12. A sensor interface according to claim 11, wherein the processor is further configured to transmit the data indicated as not received from the sensor interface, in response to receiving the signal from the target electronic device indicating data not received from the sensor interface, from a volatile memory in response to determining that the data is stored in the volatile memory, or from a non-volatile memory in response to determining that the data is not stored in the volatile memory.

13. A sensor interface according to claim 5, wherein the volatile memory is integral with the processor.

14. A sensor interface according to claim 5, wherein the processor is further configured to determine the rate of change of the at least one parameter being monitored by the sensor based on data values in the non-volatile memory, and to determine the transmission rate of advertising packets based on the determined rate of change of the data values in the non-volatile memory.

15. A sensor interface according to claim 5, wherein the predetermined memory level comprises 50% or more of a capacity of the volatile memory.

16. A sensor comprising a sensor interface according to claim 1.

17. A non-transitory computer storage medium storing a set of computer-executable instructions that, when executed by a processor, causes the processor to perform the method of claim 3.

18. A sensor interface according to claim 1, wherein the processor is further configured to:
set the transmission rate at a first transmission rate; and
subsequently, increase the transmission rate from the first transmission rate to a second transmission rate in response to a determination that the rate of change of the at least one parameter being monitored by the sensor satisfies a threshold.

19. A method according to claim 3, further comprising, by the processor:
set the transmission rate at a first transmission rate; and
subsequently, increasing the transmission rate from the first transmission rate to a second transmission rate in response to determining that the rate of change of the at least one parameter being monitored by the sensor satisfies a threshold.

* * * * *